(12) United States Patent
Gelinck

(10) Patent No.: US 11,740,134 B2
(45) Date of Patent: Aug. 29, 2023

(54) MICROBOLOMETER AND METHOD OF MANUFACTURING

(71) Applicant: Nederlandse Organisatie voor toegepast-natuurwetenschappelijk onderzoek TNO, s-Gravenhage (NL)

(72) Inventor: Gerwin Hermanus Gelinck, Valkenswaard (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 384 days.

(21) Appl. No.: 16/763,278

(22) PCT Filed: Nov. 13, 2018

(86) PCT No.: PCT/NL2018/050757
§ 371 (c)(1),
(2) Date: May 12, 2020

(87) PCT Pub. No.: WO2019/098826
PCT Pub. Date: May 23, 2019

(65) Prior Publication Data
US 2020/0333191 A1    Oct. 22, 2020

(30) Foreign Application Priority Data
Nov. 14, 2017 (EP) .................................. 17201664

(51) Int. Cl.
*G01J 5/20* (2006.01)
*H01L 23/467* (2006.01)
(Continued)

(52) U.S. Cl.
CPC ............. *G01J 5/20* (2013.01); *G01J 5/0215* (2013.01); *G01J 5/0225* (2013.01); *G01J 5/046* (2013.01);
(Continued)

(58) Field of Classification Search
CPC .......... G01J 5/20; G01J 5/0215; G01J 5/0225; G01J 5/046; G01J 5/051; G01J 5/061; H01L 23/467
See application file for complete search history.

(56) References Cited

U.S. PATENT DOCUMENTS

| 4,831,258 | A | * | 5/1989 | Paulk | ...................... G01J 5/52 374/129 |
| 5,323,005 | A | | 6/1994 | Merkel | |

(Continued)

FOREIGN PATENT DOCUMENTS

| CN | 1727856 A | 2/2006 |
| DE | 102007030828 A1 | 1/2009 |

(Continued)

OTHER PUBLICATIONS

European Patent Office, International Search Report in corresponding International Application No. PCT/NL2018/050757, dated Apr. 29, 2019 (3 pages).

(Continued)

*Primary Examiner* — David P Porta
*Assistant Examiner* — Jeremy S Valentiner
(74) *Attorney, Agent, or Firm* — Leydig, Voit & Mayer, Ltd.

(57) ABSTRACT

A microbolometer for measuring thermal radiation comprises an electrical circuit on a perforated plastic substrate. The electrical circuit comprises at least one thermistor having a temperature dependent electric resistance, wherein the thermistor is arranged to receive the thermal radiation for changing its temperature depending on a flux of the received thermal radiation. The electrical circuit is configured to measure the electric resistance of the thermistor for calculating the thermal radiation. The microbolometer is config- (Continued)

ured to cause a gas flow through the perforations for improving thermal characteristics.

18 Claims, 4 Drawing Sheets

(51) Int. Cl.
*G01J 5/02* (2022.01)
*G01J 5/04* (2006.01)
*G01J 5/061* (2022.01)
*G01J 5/05* (2022.01)

(52) U.S. Cl.
CPC ............... *G01J 5/051* (2022.01); *G01J 5/061* (2013.01); *G01J 2005/202* (2013.01); *H01L 23/467* (2013.01)

(56) References Cited

U.S. PATENT DOCUMENTS

| | | | |
|---|---|---|---|
| 5,523,564 A | 6/1996 | Yamada et al. | |
| 5,626,686 A * | 5/1997 | Yoshida | H01L 31/03926 |
| | | | 136/258 |
| 6,326,610 B1 | 12/2001 | Muramatsu et al. | |
| 9,664,569 B2 | 5/2017 | Mittleman et al. | |
| 2004/0174677 A1 * | 9/2004 | Chang | H01L 23/4093 |
| | | | 257/E23.099 |
| 2014/0117201 A1 * | 5/2014 | Barlow | G01J 5/20 |
| | | | 29/841 |
| 2015/0362374 A1 | 12/2015 | Wheeler et al. | |
| 2018/0335347 A1 * | 11/2018 | Herrmann | G01J 5/045 |

FOREIGN PATENT DOCUMENTS

| | | | | |
|---|---|---|---|---|
| EP | 0856888 A2 | 8/1998 | | |
| EP | 3064914 A1 | 9/2016 | | |
| JP | 2006/250736 A | 9/2006 | | |
| JP | 4184325 B2 * | 11/2008 | ............. | G01N 25/32 |
| JP | 2011/145296 A | 7/2011 | | |
| JP | 2016/502071 A | 1/2016 | | |
| WO | WO 2011/145295 A1 | 11/2011 | | |
| WO | WO 2017/089604 A1 | 6/2017 | | |

OTHER PUBLICATIONS

Japanese Patent Office, Non-Final Office Action in corresponding Japanese Application No. 2020-522963 dated Sep. 27, 2022 (4 pages).

* cited by examiner

MICROBOLOMETER AND METHOD OF MANUFACTURING

CROSS-REFERENCE TO RELATED APPLICATIONS

This patent application is a U.S. National Phase of PCT International Application No. PCT/NL2018/050757, filed Nov. 13, 2018, entitled "Microbolometer and Method of Manufacturing," which claims priority to European Application No. 17201664.4, filed Nov. 14, 2017, which are both expressly incorporated by reference in their entireties, including any references contained therein.

TECHNICAL FIELD AND BACKGROUND

The present disclosure relates to a microbolometer for measuring thermal radiation, a thermal imaging system comprising the microbolometer and a method of manufacturing the microbolometer.

Applications of thermal imaging systems are vast. Situations that can be readily improved by thermal imaging include driver awareness at night or in foggy conditions, and firefighting. Military applications include battlefield surveillance, minefield detection, missile location, and camouflage detection. In the medical field, IR detection can be used to analyze blood flow, observe muscular functions for physical therapy, image wounds or burns, determine body temperature, or locate tumors. Industrial applications include monitoring equipment, circuit boards, piping, furnaces, insulation coverage, and more.

A bolometer is a device for measuring the power of incident electromagnetic radiation via the heating of a material with a temperature-dependent electrical resistance, also referred to as a thermistor. A microbolometer is a specific type of bolometer e.g. used as a detector in a thermal camera. For example, thermal radiation with wavelengths typically above one micrometer, e.g. between 7.5-14 µm impinges a detector material, heating it, and thereby changing its electrical resistance. This resistance change can be measured and processed into temperatures, e.g. to construct an image. One advantage of microbolometers over previous types of infrared detecting equipment is that they typically do not require exotic and expensive cooling methods such as Stirling cycle and/or liquid nitrogen coolers. Accordingly, the microbolometer may be less expensive to operate and easier to move e.g. as part of a thermal camera.

The emergence of microbolometers has opened new opportunities for IR detection for both military and commercial applications due to their small size, less power consumption, making these the ideal choice for applications requiring high unit numbers with relatively lower performance. One challenging factor in developing a highly sensitive detector is to develop a thermometer material compatible with large-area technology to achieve high thermal isolation in the smallest possible area. Current (uncooled) microbolometers products however use very expensive microelectromechanical systems (MEMS) silicon technology to make thermally isolated hanging membranes. For example, the use of silicon substrates allows the integration of the readout electronics underneath the pixel. However, it may lead to high cost when scaling to larger-sized detectors. In an approach by A. J. Syllaios, et al. ("Amorphous Silicon Microbolometer Technology," Mat. Res. Soc. Symp. Proc. 609 (2000): A14.4.1-A14.4.6), an a-Si TFT array is used on a glass substrate to select each pixel individually, and the signals are processed at the edge(s) of the array.

There remains a desire to provide an improved microbolometer which maintains at least some of the advantages of known devices while addressing remaining challenges such as manufacturability.

SUMMARY

In one aspect, a microbolometer for measuring thermal radiation is provided. The microbolometer comprises an electrical circuit with at least one thermistor. The thermistor has a temperature dependent electric resistance. The thermistor is arranged to receive the thermal radiation for changing its temperature depending on a (flux of) the received thermal radiation. The thermistor is electrically connected to the circuit via electrodes. The electrical circuit is configured to measure the electric resistance of the thermistor via the electrodes for calculating the thermal radiation. Advantageously, the circuit, or at least the thermistor and at connecting electrodes are disposed on a plastic substrate. The plastic substrate comprises one or more perforations therethrough. Further advantageously, the microbolometer is configured to cause a gas flow through the one or more perforations, e.g. using a pump.

By providing the thermistor and connecting electrodes on a plastic substrate, it may be thermally isolated from other structures. By providing perforations in the substrate, the thermal isolation may be further improved. By a gas flow through the perforation the heating can be further isolated and kept localized. By providing perforations with gas flow adjacent and partially surrounding a circumference of the thermistor, its heating may be isolated from nearby circuitry, e.g. other thermistors. Also, the gas flow may act as a heat sink such that the thermistor can more rapidly attain a steady state or equilibrium temperature indicative of the thermal radiation. In this way a faster response may be obtained. For example an air flow may be provided to isolate and/or equilibrate thermistors. By flowing the gas through the perforations, mainly in a direction transverse to the substrate, the exchange of heat between neighboring components by convection can be avoided compared to flowing gas along the substrate surface. By flowing the gas from a back side to a front side (comprising the circuit), heat is transported away from the components and the substrate may have a more constant temperature. The thermistors may form an array of pixels interconnected by electrodes. To diminish heat exchange of thermistors via the electrically and thermally conductive electrodes, perforations may be provided near the electrodes. To further diminish heat exchange, the electrodes should be made thin and narrow. To further diminish heat exchange, the electrodes may comprise conducting materials that have a lower heat conductivity than metals. Examples are conducting polymers such as doped polythiophenes, polypyrroles and polyaniline, and transparent conducting oxides such as indium tin oxide.

BRIEF DESCRIPTION OF DRAWINGS

These and other features, aspects, and advantages of the apparatus, systems and methods of the present disclosure will become better understood from the following description, appended claims, and accompanying drawing wherein:

FIG. 4A schematically illustrates an embodiment for an array of thermistors on a plastic substrate interconnected by electrodes and with various perforations there between;

DESCRIPTION OF EMBODIMENTS

Figure 1A:
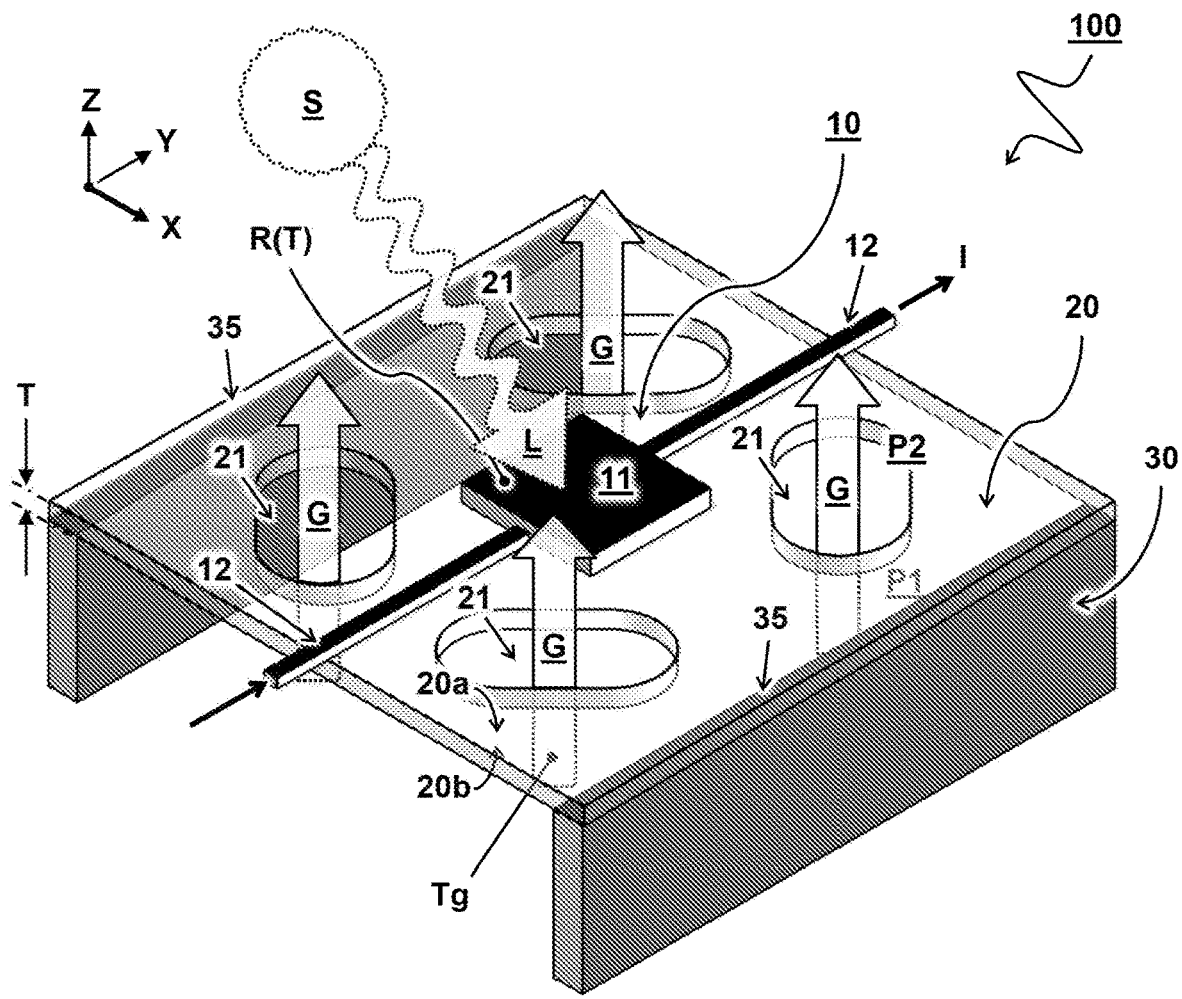
FIG. 1A schematically illustrates a perspective view of an embodiment of a microbolometer.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
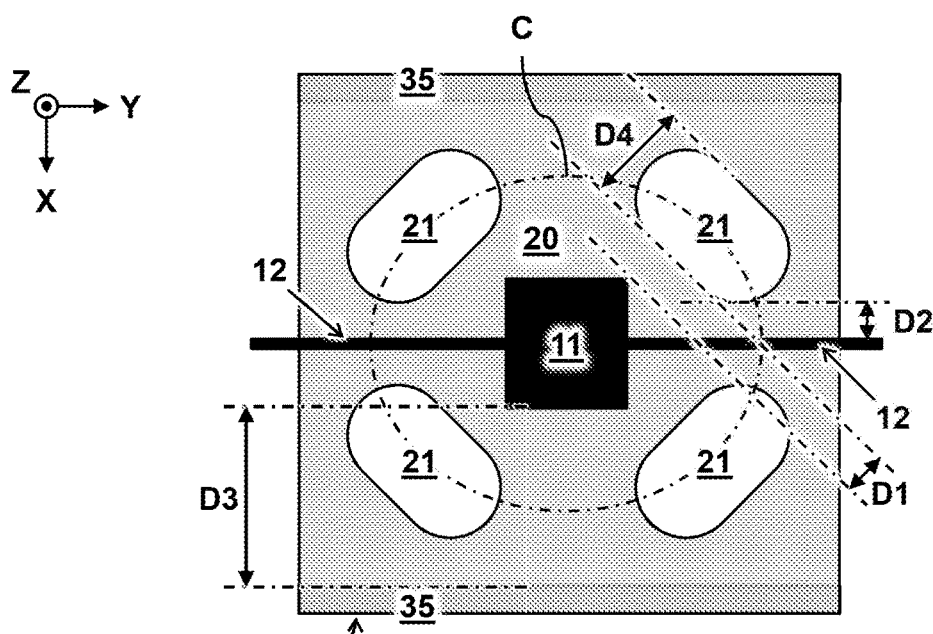
FIG. 1B schematically illustrates a top view of the embodiment of FIG. 1A.

FIG. 1A schematically illustrates a perspective view of an embodiment of a microbolometer 100; FIG. 1B schematically illustrates a top view of the embodiment of FIG. 1A.

One aspect of the present disclosure provides a microbolometer 100 for measuring thermal radiation L. Typically the microbolometer 100 comprises an electrical circuit 10. The electrical circuit 10 comprises at least one thermistor 11. The thermistor 11 has a temperature T dependent electric resistance R, indicated as R(T). The thermistor 11 is arranged to receive thermal radiation L which may cause changing or adapting its temperature T depending on the received thermal radiation L, e.g. a flux of the radiation. In the embodiment shown, the thermistor 11 is electrically connected to the circuit via electrodes 12.

Typically, the electrical circuit 10 is configured to measure the electric resistance R of the thermistor 11 via the electrodes 12 for calculating the thermal radiation L. This may involve other circuitry and components not shown here. For example, a voltage is applied over the electrodes 12 on either side of the thermistor 11 and a resulting electric current I is measured to determine the resistance according to Ohm's law by $R=V/I$.

In a preferred embodiment, the thermistor 11 is disposed on a plastic substrate 20. More preferably at least a sub-length of the connecting electrodes, or even the entire circuit is disposed on the plastic substrate 20. In a further preferred embodiment, the plastic substrate 20 comprises perforations 21 therethrough. In some embodiments, it is preferred that the microbolometer 100 is configured to cause a gas flow G through the one or more perforations 21. In other embodiments the gas flow may be omitted.

In some embodiments, e.g. as shown in FIG. 1B, the perforations 21 are disposed in an area of the plastic substrate 20 adjacent and partially surrounding a circumference C of the thermistor 11. For example, at least ten percent of the circumference C is occupied by the perforations 21, preferably at least twenty percent, or more, e.g. between thirty and eighty percent. It will be appreciated that the more the thermistor 11 is surrounded by the one or more perforations 21, the better may the thermistor 11 be thermally isolated from its surroundings by the gas flow G. Also, the gas flow G may act as a heat sink such that the thermistor 11 can more rapidly attain a steady state or equilibrium temperature indicative of the thermal radiation L. In this way a faster response may be obtained.

In some embodiments, the gas has a fixed temperature (Tg). For example, the microbolometer 100 comprises a temperature control (not shown) for setting the gas temperature Tg. For example, the gas temperature Tg is set close to an equilibrium temperature which the thermistor 11 may reach depending on the source S of thermal radiation L. Preferably, an excessive temperature difference is avoided between the temperature of the gas and a maximum or minimum temperature that the thermistor 11 may reach depending on the thermal radiation L. Alternatively to a fixed or forced temperature setting, the gas may simply have an ambient temperature. For example, a deviation in temperature of the thermistor 11 from the ambient temperature can be indicative of the thermal radiation L.

In some embodiments, as illustrated e.g. in FIG. 1B, the perforations 21 are separated from the thermistor 11 with at least a first distance D1 therebetween. For example, the first distance D1 is more than one micrometer, preferably more than two micrometer, e.g. between three and twenty micrometer, more preferably between five and ten micrometer. On the one hand, the first distance D1 may be selected sufficiently far away to prevent the gas flow G directly contacting the thermistor 11 which may cause excessive temperature equilibration and may diminish sensitivity. On the other hand, when multiple thermistors are used in a high resolution array, e.g. 50 μm pixel period, the maximum distance may be dependent on a limited area therebetween.

In some embodiments, as illustrated e.g. in FIG. 1B, at least some of the perforations 21 are separated from a nearest electrode 12 by at most a second distance D2 therebetween. For example, the second distance D2 is less than ten micrometer, preferably less than five micrometer, more preferably less than three micrometer, or even less than one micrometer. It will be appreciated that the second distance D2 may be selected relatively close by to allow sufficient heat exchange between the electrodes 12 and gas flow G. Accordingly, any heat which would flow from the thermistor 11 through the electrodes 12 may be isolated from reaching adjacent circuitry and vice versa. In some further preferred embodiments, the second distance D2 is less than the first distance D1. In this way heat exchange of the thermistor 11 with the gas flow G may primarily take place via the electrodes 12.

In a preferred embodiment, a material of the plastic substrate 20 has a relatively low thermal conductivity (at an operating temperature of the microbolometer, e.g. room temperature 293 K). For example, the material has a thermal conductivity less than 1 W m$^{-1}$ K$^{-1}$, preferably less than 0.5 W m$^{-1}$ K$^{-1}$, more preferably less than 0.1 W m$^{-1}$ K$^{-1}$, or even less, e.g. in a range between $10^{-5}10^{-2}$ W m$^{-1}$ K$^{-1}$. The lower the thermal conductivity of the plastic substrate 20, the less the heat may be conducted to or from the thermistor 11 via the substrate, e.g. by nearby circuitry such as other thermistors. For example, the plastic substrate 20 comprises an (organic) polymer material such as polyamide, polyimide, polycarbonate, polyether ether ketone (PEEK), or polyester. For example polyimide typically has a thermal conductivity of about 0.12 W m$^{-1}$ K$^{-1}$. For example, Polyethylene terephthalate PET typically has a thermal conductivity 0.15 to 0.24 W m$^{-1}$ K$^{-1}$. This may be contrasted e.g. to a silicon substrate having a typical thermal conductivity of 150 W m$^{-1}$ K$^{-1}$.

In a preferred embodiment, the plastic substrate 20 is relatively thin, e.g. has a thickness T less than two hundred micrometers, preferably less than hundred micrometers, more preferably less than fifty micrometers, e.g. between five and thirty micrometers, or less. The lower the thickness T of the plastic substrate 20, the less the thermal conduction may be through the substrate which can further contribute to the thermal isolation of the thermistor 11. On the other hand, the thickness should still provide sufficient support the circuit and/or avoid breakage.

In some embodiments, the plastic substrate 20 may be flexible. In a preferred embodiment, the microbolometer 100 comprises a support structure 30 with contact points 35 for spanning the (flexible) plastic substrate 20 therebetween. In the embodiment shown, the thermistor 11 is at least at a third distance D3 removed from the nearest contact points 35. Preferably the third distance D3 is at least fifty micrometer, preferably at least hundred micrometer, more than one millimeter, or even more than one centimeter. The higher the third distance D3 to the nearest support structure, the better the thermal isolation of the thermistor 11 from that support structure. On the other hand, for a flexible plastic substrate 20 it may be desired to prevent sagging e.g. by limiting the maximum distance between support structures, e.g. provide intermediate support pillars. To further improve thermal isolation, also the support structure may comprise a material with low thermal conductivity, e.g. a (rigid) plastic support structure.

In a preferred embodiment, the perforations 21 make up a significant fraction of the substrate surface of the plastic substrate 20. For example, the ratio of the total surface taken away by the perforations over the total substrate surface (or at least the surface between circuit parts) is more than 1%, preferably more than 5%, e.g. between 10-70%, or 20-50%. In some embodiments, e.g. as shown, each of the one or more perforations 21 has a minimum diameter D4. For example, the minimum diameter D4 is more than one micrometer, preferably more two micrometer, e.g. between five and twenty micrometer, or higher depending on the scale of the circuit. It will be appreciated that a higher ratio of holes may further contribute to the thermal isolation of the thermistor, e.g. reduce heat conduction through the substrate between thermistors or other parts.

Figure 2A:
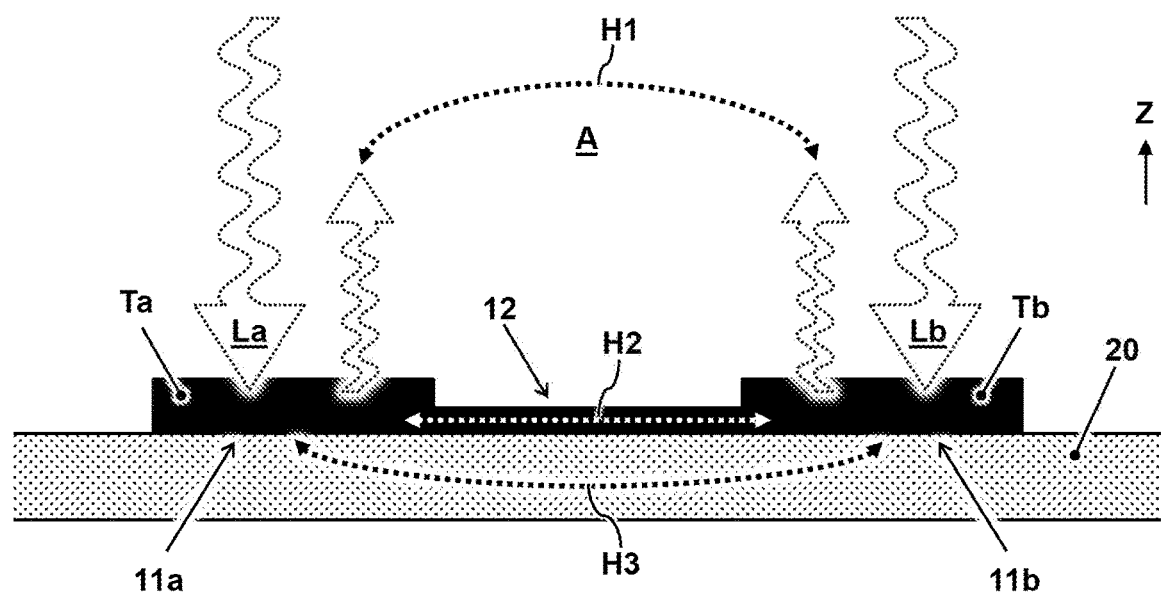
FIG. 2A schematically illustrates a cross-section view of a microbolometer with various modes of heat exchange between thermistors.
Figure 2B:
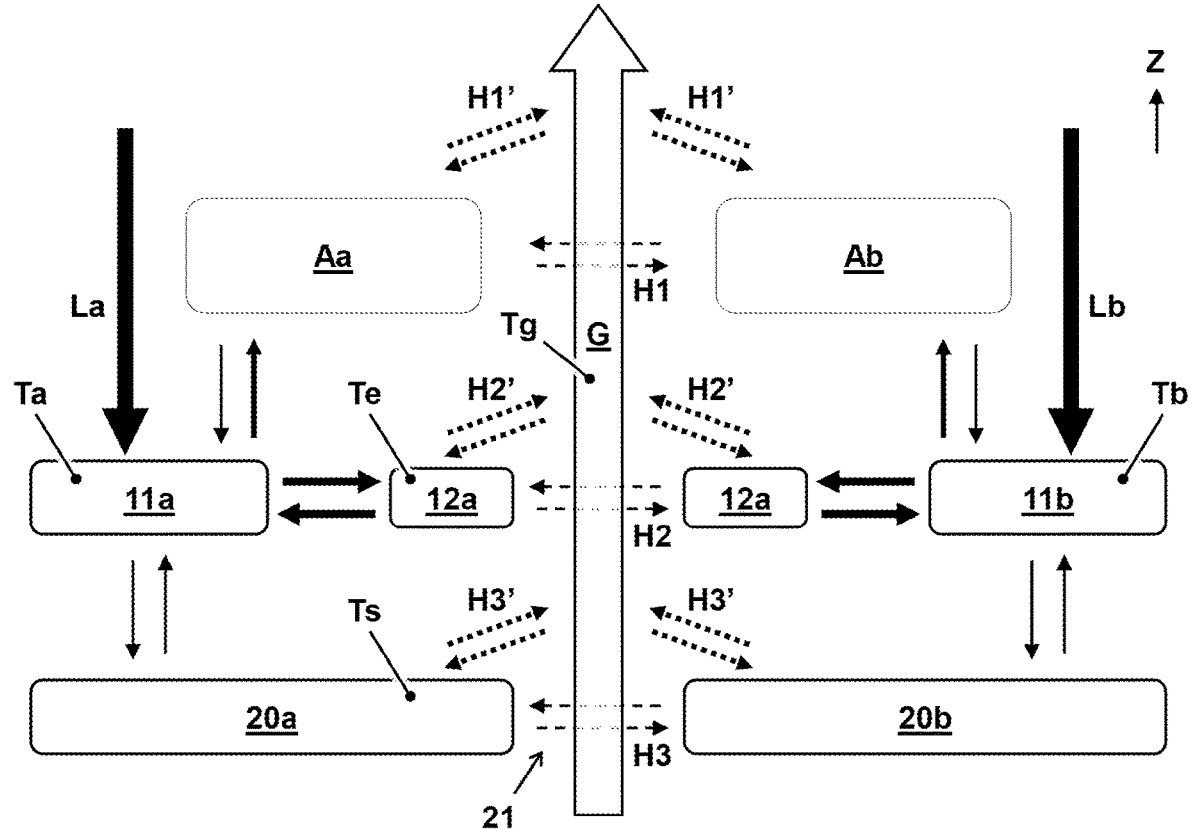
FIG. 2B schematically illustrates at least partial interruption of the heat exchange by a gas flow there between FIG. 3A schematically illustrates an embodiment of a microbolometer integrated in a first imaging device.

FIG. 2A schematically illustrates a cross-section view of a microbolometer 100 with various modes of heat exchange H1,H2,H3 between thermistors 11a,11b via intermediate structures and volumes. FIG. 2B schematically illustrates at least partial interruption of the heat exchange H1,H2,H3 by a gas flow G there between.

For example a first mode of heat exchange H1 can be heat conduction and/or convection through the volume of gas, e.g. air, above the circuit. For example a second mode of heat exchange H2 can be conduction of heat via the electrical connection 12 between thermistors. For example a third mode of heat exchange H3 can be heat conduction via the substrate 20. When using a plastic substrate, particularly a thin plastic substrate with perforations, the third mode of heat exchange H3 can be relatively low compared to the second mode of heat exchange H2 via the electrode.

By adding a gas flow G through the perforations, as shown in FIG. 2B, the modes of heat exchange between thermistors may be further diminished. For example, the gas flow may effectively separate volume above the circuit in two volumes Aa,Ab, which primarily exchange heat H1' with gas flow G and less with each other. When the gas flow G is in relative close proximity to the electrode 12 between thermistors, parts of the electrode 12a,12b connecting to either thermistors 11a,11b may also exchange heat H2' with the gas flow G leading to further thermal isolation. Finally, the gas flow G through a perforation 21 between the thermistors 11a,11b may also exchange heat H3' with the substrate thereby further interrupting heat exchange between the thermistors 11a,11b.

As described herein, electrodes are used for measuring electrical resistance of the thermistor, which electrodes may have certain minimum desired electrical conductivity, e.g. at least one siemens per meter (S/m), preferably at least ten, at least hundred, or at least thousand siemens per meter, or more. To prevent undesired temperature equilibration, thermal conductivity of the electrodes is preferably minimal. In one embodiment, thermal conductivity of the electrodes is minimized by giving them a relatively small width and/or thickness, e.g. a cross-section less than ten square micrometers ($\mu m^2$), preferably less than one square micrometer, e.g. between 0.01-1 $\mu m^2$, or less. For example, a minimum thickness of the electrodes may be ten nanometers, and combined with a minimal width of two micrometer this could provide a cross-section of 0.02 $\mu m^2$.

In some embodiments, the electrodes may comprise conductive polymers or, more specifically, intrinsically conducting polymers (ICPs). For example, linear-backbone "polymer blacks" (polyacetylene, polythiophene, polypyrrole, and polyaniline) and their copolymers are a main class of conducting polymers. It will be appreciated that conducting polymers may have a relatively low thermal conductivity while providing sufficient electrical conductivity. For example, Liu et al (Macromolecules, 2015, 48 (3), pp 585-591, DOI: 10.1021/ma502099t) reports that mixtures of poly(3,4-ethylenedioxythiophene) and polystyrenesulfonate (PEDOT:PSS) can have relatively high electrical conductivity (500 S cm$^{-1}$) with thermal conductivity between 0.3 to 1.0 W m$^{-1}$ K$^{-1}$.

In some aspects, the microbolometer 100, as described herein can be part of an apparatus, e.g. (thermal) imaging camera.

Figure 3A:
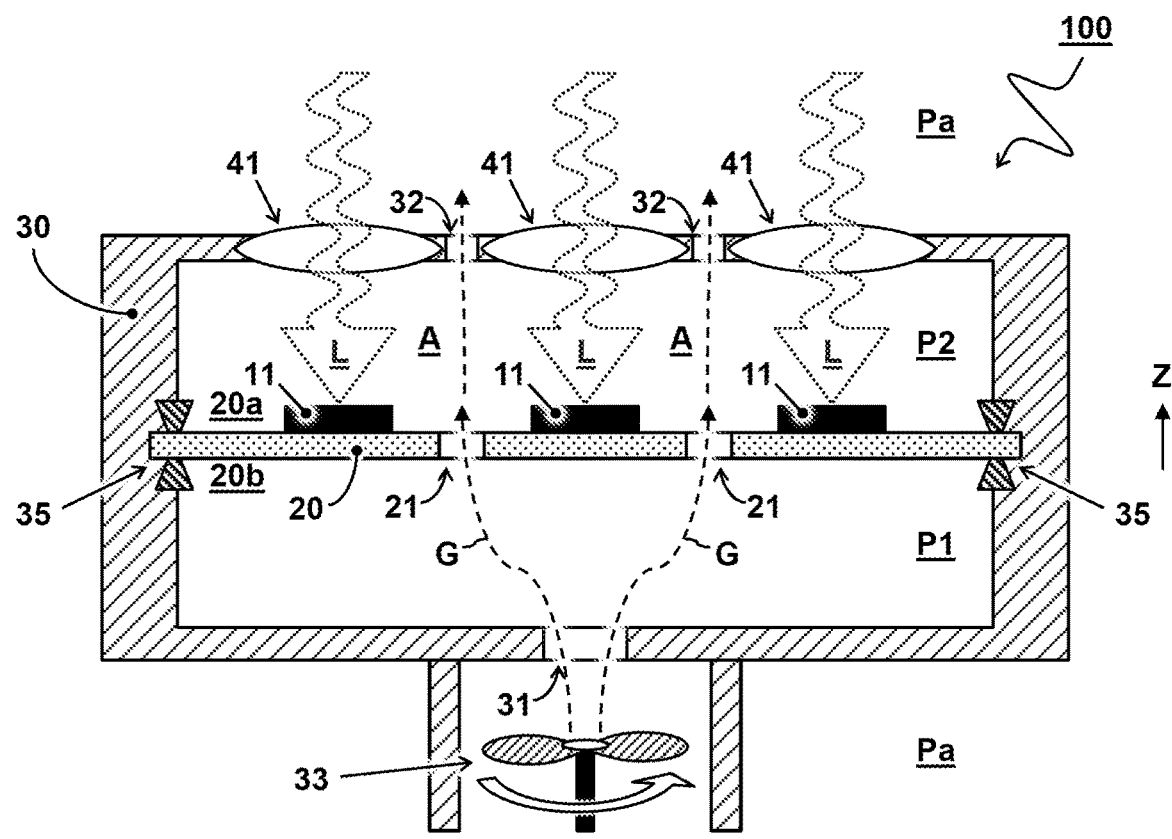
FIG. 3B schematically illustrates another embodiment of a microbolometer integrated in a second imaging device.
Figure 3B:
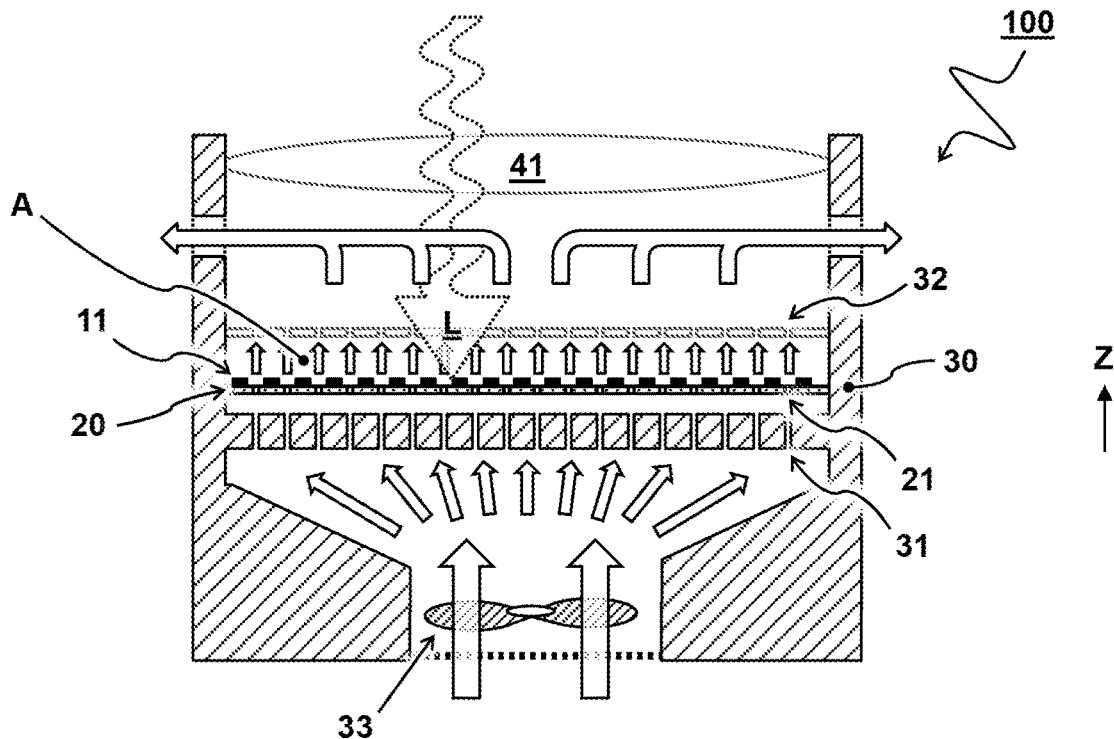

FIG. 3A schematically illustrates an embodiment of a microbolometer 100 integrated in a first imaging device. FIG. 3B schematically illustrates another embodiment of a microbolometer 100 integrated in a second imaging device.

In a preferred embodiment, the electrical circuit 10 comprises a plurality of thermistors 11a,11b. In a further preferred embodiment, the perforations 21 are disposed between each set of neighboring thermistors 11a,11b. Accordingly, the gas flow G may reduce a heat exchange between the neighboring thermistors 11a,11b.

In the embodiment shown, the contact points 35 of the support structure 30 comprises clamping means to hold the plastic substrate 20 there between. Typically, the plastic substrate 20 has a front side 20a and a back side 20b. In the embodiment shown, the electrical circuit 10 with the thermistor 11 is disposed on the front side 20a. Preferably, the gas flow G is configured to flow from the backside 20b to the front side 20a, i.e. from the unoccupied side to the side with the circuit. In the embodiment shown, the microbolometer 100 is configured to flow the gas G through the perforations in a direction Z transverse to a surface of the plastic substrate 20, or at least transverse at the front side 20a of the plastic substrate 20.

In some embodiments, the microbolometer 100 comprises a flow guiding structure 31,32 configured to maintain the gas flow G in a direction Z transverse and away from the front side 20a of the substrate surface after the gas flowing through the perforations 21. In this way it may be avoided that gas heated by one thermistor can affect another thermistor. For example, the microbolometer 100, as shown, comprises one or more gas vent holes 32 above the front side 20a of the plastic substrate 20. In the embodiment shown, the gas vent holes 32 are directly above the perforations 21, but these can also be at other positions while maintaining the transvers gas flow.

In a preferred embodiment, the microbolometer 100 comprises a pressurization means, e.g. pump, to provide a first pressure P1 at a back side 20b of the plastic substrate 20 and/or a second pressure P2 at a front side 20a of the plastic substrate 20. Typically, the pressurization means or pump may be any type of device configured to (in use) cause and/or maintain, at least intermittently, a pressure difference and/or gas flow through the perforations, e.g. a positive displacement (rotary, reciprocating, linear, etc), centrifugal and/or axial-flow pump. For example the pump may cause a relatively high pressure at one side of the substrate (supply) and/or an relatively low pressure at the other side of the substrate (exhaust). Accordingly, a pressure difference between the pressures P1,P2 at the back side and front side may cause the gas flow G through the perforations 21. Preferably, the first pressure P1 at the back side is higher than the second pressure P2 at the front side. In some embodiments, as shown, the second pressure P2 is higher than an ambient pressure Pa. In this way, the gas may continue to flow from a compartment or volume "A" above the plastic substrate 20 to outside the microbolometer 100. The gas may also flow to another compartment (not shown).

In a preferred embodiment, the gas flow G comprises an airflow with ambient temperature. In this way complicated gas and temperature control systems may be avoided. For example, a simple air fan 33 or other type of pump may be used to cause air from outside the microbolometer 100 to flow through the perforations 21. In the embodiment shown, the flow guiding structure comprises a distribution filter with openings 31 to distribute the gas flow evenly over (all) the perforations 21 in the plastic substrate 20. Preferably, the gas flow G is thus the same through all perforations.

Typically the gas flow G may be relatively limited at a fixed volume per second. For example the volume of gas per second per square centimeter area of the plastic substrate used is preferably less than one cubic centimeter, less than 0.1 cm$^3$, or less. If the gas flow is too high, this may cause too rapid equilibration of the thermistors diminishing their sensitivity. Also other gas flow may be envisaged depending on circumstances.

In some embodiments, the gas flow volume may be controllable, e.g. depending on a temperature of the gas and/or depending on a desired sensitivity for the thermistors. In other or further embodiments, the gas flow may be intermittently switched. For example, the gas flow is switched off, or low, during a measurement and switched on or higher between measurements. In this way, the sensitivity during measurement can be relatively high, while the thermistors can be quickly equilibrated between measurements to a base temperature value.

In some embodiments, the imaging device may comprise projection optics to (thermally) image an object onto an array of thermistors. In the embodiments shown, one or more lenses 41 can be used, e.g. lenses that are transparent to thermal radiation such as calcium fluoride or barium fluoride. Alternatively, or additionally reflective optics may be used, e.g. gold coated mirrors. Also other optical components may be present, e.g. filters to remove visible wavelengths.

Figure 4A:
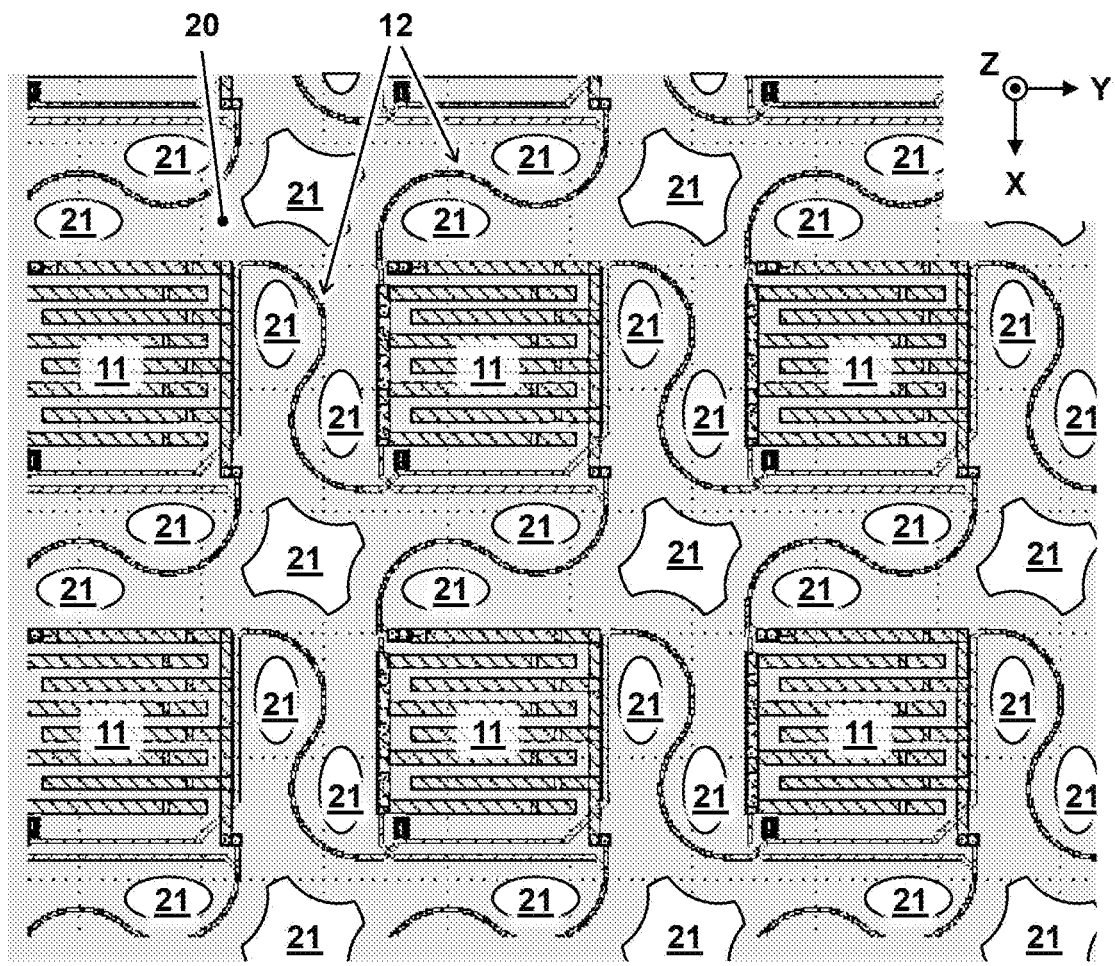
Figure 4B:
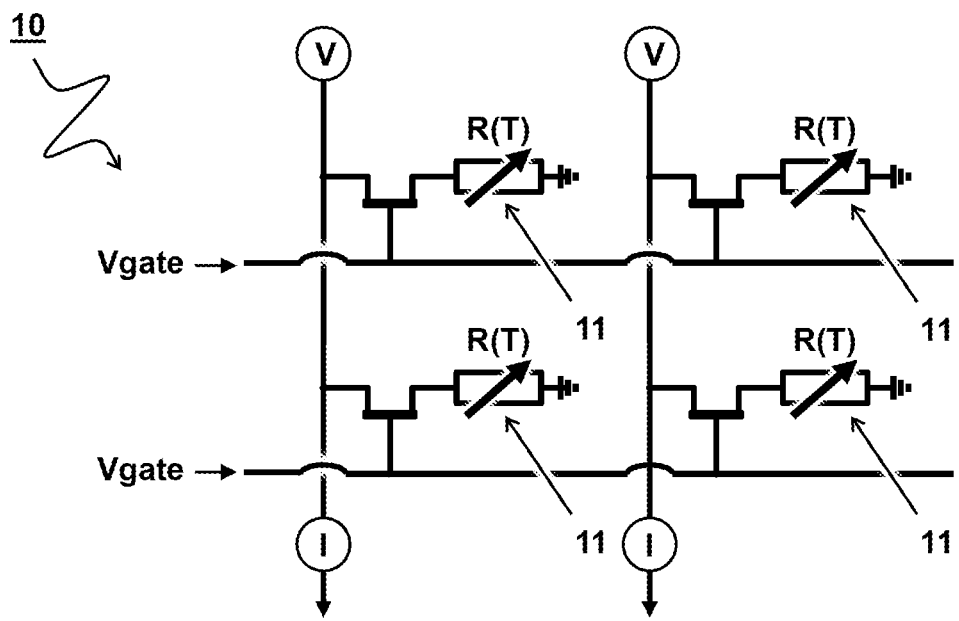
FIG. 4B schematically illustrates an embodiment for an electrical circuit with an active matrix of thermistors.

FIG. 4A schematically illustrates an embodiment for an array of thermistors 11 on a plastic substrate 20 interconnected by electrodes 12 and with various perforations 21 there between. FIG. 4B schematically illustrates an embodiment for an electrical circuit 10 with an active matrix of thermistors 11, e.g. TFT array. Preferably the thermistor 11 comprises a negative temperature coefficient (NTC) material. For example, in the embodiment shown the NTC material is disposed between opposing finger electrodes to form the thermistor 11.

In a preferred embodiment, e.g. as illustrated, the electrical circuit 10 comprises an array of thermistors 11 forming pixels. In this way, e.g. a heat imaging sensor may be formed. For example, pixels or thermistors may typically be distributed at a pitch between 10-100 μm, e.g. 50 μm. For example, an array of 1000×1000 pixels can be formed on a plastic substrate of 5×5 cm. Of course also other distances and sizes are possible. In the embodiment shown, the pixels are interconnected by electrodes 12. Preferably, the electrical circuit 10 comprises an active matrix readout, e.g. such that the electric resistance R of individual pixels can be read out. For example, a gate voltage Vgate may be applied to a row of pixels while a current I for a particular voltage V is measured over each column of pixels.

One method of manufacturing a microbolometer 100 comprises applying an electrical circuit 10 onto a plastic substrate 20. The electrical circuit 10 e.g. comprises an array of thermistors 11, each having a temperature T dependent electric resistance R. The thermistors 11 may be electrically interconnected via electrodes 12, as shown. Preferably, the electrical circuit 10 is configured to measure the electric resistance R of each thermistor 11. For example, the electrical circuit 10 is applied by printing or other means of deposition.

The method may further comprise perforating areas of the (single) plastic substrate 20 wherein the perforations 21 are disposed between sets of neighboring thermistors 11a,11b in the array of thermistors. For example, the perforations 21 may be conceived for allowing a gas flow G through the perforations 21 to thermally isolate the neighboring thermistors 11a,11b from each other. For example, the plastic substrate 20 is perforated by a laser targeting each area, or using another type of high intensity light beam, e.g. flash lamp combined with a mask, e.g. to locally ablate the plastic substrate 20. Also other means can be used, e.g. a cutting knife of stamp tool. The perforating of the plastic substrate 20 may occur before or after applying the electrical circuit 10. In some embodiments, a pre-perforated substrate is used, and the electrical circuit 10 is applied to remaining areas of the substrate between the perforations.

For the purpose of clarity and a concise description, features are described herein as part of the same or separate embodiments, however, it will be appreciated that the scope of the invention may include embodiments having combinations of all or some of the features described. For example, while embodiments were shown for various arrangements of thermistors and substrates with perforations, also alternative arrangements may be envisaged by those skilled in the art having the benefit of the present disclosure for achieving a similar function and result. For example, optical components may be combined or split up into one or more alternative components. The various elements of the embodiments as discussed and shown offer certain advantages, such as providing thermistors that are thermally isolated from their surroundings and/or each other. Of course, it is to be appreciated that any one of the above embodiments or processes may be combined with one or more other embodiments or processes to provide even further improvements in finding and matching designs and advantages. It is appreciated that this disclosure offers particular advantages to thermal, and in general can be applied for any application of measuring electromagnetic radiation on one or more sensors.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A microbolometer for measuring thermal radiation, the microbolometer comprising an electrical circuit, wherein the electrical circuit comprises:
    at least one thermistor having a temperature dependent electric resistance, wherein the at least one thermistor is arranged to receive the thermal radiation for changing its temperature depending on the received thermal radiation;
    at least one pair of electrodes;
    a plastic substrate having a thermal conductivity less than 1 W m$^{-1}$K$^{-1}$ at 293 K;
    a pump, and
    a flow guiding structure;
    wherein the at least one thermistor is electrically connected into the electrical circuit via the at least one pair of electrodes,
    wherein the electrical circuit is configured to measure the temperature dependent electric resistance of the at least one thermistor via the at least one pair of electrodes for calculating the thermal radiation,
    wherein the at least one thermistor and at least a sub-length of the at least one pair of electrodes are disposed on the plastic substrate,
    wherein the plastic substrate comprises one or more perforations therethrough, and
    wherein the pump is configured to cause, facilitated by the flow guiding structure, a gas flow through the one or more perforations during and/or in between measuring the temperature dependent electric resistance of the at least one thermistor via the electrodes for calculating the thermal radiation.

2. The microbolometer according to claim 1, wherein the at least one thermistor comprises a plurality of thermistors disposed on the plastic substrate, wherein the one or more perforations are disposed between neighboring ones of the plurality of thermistors.

3. The microbolometer according to claim 1, wherein the pump is configured to flow the gas flow through the one or more perforations in a direction transverse to a surface of the plastic substrate.

4. The microbolometer according to claim 1, wherein the plastic substrate has a front side and a back side,
    wherein the electrical circuit with the at least one thermistor is disposed on the front side, and
    wherein the pump is configured to flow the gas flow from the backside to the front side.

5. The microbolometer according to claim 1,
    wherein the flow guiding structure is configured to maintain the gas flow in a direction transverse and away from the front side of the substrate surface after the gas flow flowing through the perforations.

6. The microbolometer according to claim 1, wherein the plastic substrate has a thickness less than a hundred micrometers.

7. The microbolometer according to claim 1, wherein the plastic substrate is flexible and the microbolometer comprises a support structure with contact points for spanning the plastic substrate therebetween.

8. The microbolometer according to claim 1, wherein the perforations are disposed in an area of the plastic substrate adjacent and partially surrounding a circumference of the at least one thermistor.

9. The microbolometer according to claim 1, wherein the perforations make up a portion of the substrate surface of the plastic substrate, wherein a percentage of a total perforation surface of the substrate surface taken by the perforations is more than five percent.

10. The microbolometer according to claim 1, wherein each of the one or more perforations are separated from ones of the at least one thermistor by a first distance there between, wherein the first distance is between three and twenty micrometers.

11. The microbolometer according to claim 1, wherein the perforations are separated from a nearest electrode of the at least one pair of electrodes by a second distance that is less than ten micrometers.

12. The microbolometer according to claim 1, wherein the at least one pair of electrodes comprise a conductive polymer.

13. The microbolometer according to claim 1, wherein the gas flow comprises an airflow with an ambient temperature.

14. The microbolometer according to claim 1, configured to form a part of a thermal imaging camera.

15. A method of manufacturing a microbolometer for measuring thermal radiation, the method comprising:

applying an electrical circuit onto a plastic substrate, the electrical circuit comprising:
an array of thermistors, wherein each thermistor of the array of thermistors has a temperature dependent electric resistance, wherein ones of the thermistors of the array of thermistors are each electrically interconnected via at least one pair of electrodes, and wherein the electrical circuit is configured to measure the temperature dependent electric resistance of each thermistor of the array of thermistors;
perforating areas of the plastic substrate wherein the perforations are disposed between sets of neighboring thermistors in the array of thermistors, wherein the perforations are conceived for allowing a gas flow through the perforations to thermally isolate the neighboring thermistors from each other,
wherein the array of thermistors comprises a plurality of thermistors disposed on the plastic substrate, and
wherein the perforations are arranged such that the perforations meet at least one condition taken from the group consisting of:
the perforations in the plastic substrate are disposed between neighboring ones of the plurality thermistors disposed on the plastic substrate;
the perforations are disposed in an area of the plastic substrate adjacent and partially surrounding a circumference of respective ones of the plurality of thermistors;
the perforations make up a portion of the substrate surface of the plastic substrate, wherein a percentage of a total perforation surface of the substrate surface taken by the perforations is more than five percent;
each of the one or more perforations are separated from ones of the plurality thermistors by a first distance there between, wherein the first distance is between three and twenty micrometers; and
the perforations are separated from a nearest electrode of the at least one pair of electrodes by a second distance that is less than ten micrometers.

16. The method according to claim 15, wherein the plastic substrate is a material having a thermal conductivity less than 1 W m$^{-1}$ K$^{-1}$ at 293 K.

17. A microbolometer for measuring thermal radiation, the microbolometer comprising an electrical circuit, wherein the electrical circuit comprises:
at least one thermistor having a temperature dependent electric resistance, wherein the at least one thermistor is arranged to receive the thermal radiation for changing its temperature depending on the received thermal radiation;
at least one pair of electrodes;
a plastic substrate;
a pump; and
a flow guiding structure;
wherein the at least one thermistor is electrically connected into the electrical circuit via the at least one pair of electrodes,
wherein the electrical circuit is configured to measure the temperature dependent electric resistance of the at least one thermistor via the at least one pair of electrodes for calculating the thermal radiation,
wherein the at least one thermistor and at least a sub-length of the at least one pair of electrodes are disposed on the plastic substrate,
wherein the plastic substrate comprises one or more perforations therethrough,
wherein the pump is configured to cause, facilitated by the flow guiding structure, a gas flow through the one or more perforations during and/or in between measuring the temperature dependent electric resistance of the at least one thermistor via the electrodes for calculating the thermal radiation; and
wherein the perforations are arranged such that the perforations meet at least one condition taken from the group consisting of:
the perforations in the plastic substrate are disposed between neighboring ones of a plurality thermistors disposed on the plastic substrate;
the perforations are disposed in an area of the plastic substrate adjacent and partially surrounding a circumference of the at least one thermistor;
the perforations make up a portion of the substrate surface of the plastic substrate, wherein a percentage of a total perforation surface of the substrate surface taken by the perforations is more than five percent;
each of the one or more perforations are separated from ones of the plurality thermistors by a first distance there between, wherein the first distance is between three and twenty micrometers; and
the perforations are separated from a nearest electrode of the at least one pair of electrodes by a second distance that is less than ten micrometers.

18. The microbolometer according to claim 17, wherein the plastic substrate is a material having a thermal conductivity less than 1 W m$^{-1}$ K$^{-1}$ at 293 K.

* * * * *